(12) United States Patent
Cleeves et al.

(10) Patent No.: US 6,580,124 B1
(45) Date of Patent: Jun. 17, 2003

(54) MULTIGATE SEMICONDUCTOR DEVICE WITH VERTICAL CHANNEL CURRENT AND METHOD OF FABRICATION

(75) Inventors: James M. Cleeves, Redwood City, CA (US); Vivek Subramanian, Redwood City, CA (US)

(73) Assignee: Matrix Semiconductor Inc., Santa Clara, CA (US)

( * ) Notice: Subject to any disclaimer, the term of this patent is extended or adjusted under 35 U.S.C. 154(b) by 0 days.

(21) Appl. No.: 09/639,577

(22) Filed: Aug. 14, 2000

(51) Int. Cl.[7] .............................................. H01L 29/76
(52) U.S. Cl. ....................... 257/331; 257/316; 257/325; 257/391; 257/401
(58) Field of Search ................................ 257/331, 316, 257/324, 325, 390, 391, 392, 401

(56) References Cited

U.S. PATENT DOCUMENTS

| | | |
|---|---|---|
| 3,571,809 A | 3/1971 | Nelson |
| 3,573,757 A | 4/1971 | Adams |
| 3,576,549 A | 4/1971 | Hess et al. |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |

(List continued on next page.)

FOREIGN PATENT DOCUMENTS

| | | | |
|---|---|---|---|
| DE | 197 26 085 A1 | 12/1998 | |
| EP | 0 783 181 A1 | 7/1997 | |
| JP | 61-256673 | * 11/1986 | ................. 257/316 |
| JP | 6-338602 | 12/1994 | |
| JP | 11-74382 | 3/1999 | |

OTHER PUBLICATIONS

English translation of Japanese Kokai 61–256673.*
Dov Frohman–Bentchkowsky, A fully decoded 2048–Bit Electrically Programmable FAMOS Read–Only Memory, IEEE Journal of Solid–State Circuits, vol. SC–6, No. 5, Oct. 1971.
Noriaki Sato et al., A New Programmable Cell Utilizing Insulator Breakdown, Fujitsu Limited, Nakahara–ku, Kawasaki 211, Japan, IEEE 1985.
John H. Douglas, The Route to 3–D Chips, highTechnology, Sep. 1983, vol. 3, No. 9.
James D. Plummer et al., A Self–Aligned Split–Gate Flash EEPROM Cell with 3–D Pillar Structure, Stanford University, Stanford, CA, 1999 Symposium on VLSI Technology Digest of Technical Papers.
Vivek Subramanian, Control of Nucleation and Grain Growth in Solid–Phase Crystallized Silicon for High Performance Thin Film Transistors, Stanford University, Stanford CA, Jun. 1998.
M. Arienzo et al.: "Diffusion of Arsenic in Bilayer Polycrystalline Silicon Films," J. Appl. Phys., Jan. 1984, pp. 365–369, vol. 55, No. 2, American Institute of Physics.
O. Bellezza et al.: "A New Self–Aligned Field Oxide Cell for Multimegabit Eproms," IEDM, pp. 579–582, IEEE.

(List continued on next page.)

*Primary Examiner*—Mark V. Prenty
(74) *Attorney, Agent, or Firm*—Foley & Lardner

(57) ABSTRACT

The present invention is a multibit nonvolatile memory and its method of fabrication. According to the present invention a silicon channel body having a first and second channel surface is formed. A charge storage medium is formed adjacent to the first channel surface and a second charge storage medium is formed adjacent to the second channel surface. A first control gate is formed adjacent to the first charge storage medium adjacent to the first channel surface and a second control gate is formed adjacent to the second charge storage medium adjacent to the second surface.

19 Claims, 10 Drawing Sheets

U.S. PATENT DOCUMENTS

| | | | |
|---|---|---|---|
| 3,717,852 A | 2/1973 | Abbas | |
| 3,728,695 A | 4/1973 | Frohmen-Bentchkowsky | |
| 3,787,822 A | 1/1974 | Rioult | |
| 3,846,767 A | 11/1974 | Cohen | |
| 3,863,231 A | 1/1975 | Taylor | |
| 3,877,049 A | 4/1975 | Buckley | |
| 3,886,577 A | 5/1975 | Buckley | |
| 3,922,648 A | 11/1975 | Buckley | |
| 3,980,505 A | 9/1976 | Buckley | |
| 3,990,098 A | 11/1976 | Mastrangelo | |
| 4,146,902 A | 3/1979 | Tanimoto et al. | |
| 4,177,475 A | 12/1979 | Holmberg | |
| 4,203,123 A | 5/1980 | Shanks | |
| 4,203,158 A | 5/1980 | Frohmen-Bentchkowsky et al. | |
| 4,272,880 A | 6/1981 | Pashley | |
| 4,281,397 A | 7/1981 | Neal et al. | |
| 4,419,741 A | 12/1983 | Stewart et al. | |
| 4,420,766 A | 12/1983 | Kasten | |
| 4,442,507 A | 4/1984 | Roesner | |
| 4,489,478 A | 12/1984 | Sakurai | |
| 4,494,135 A | 1/1985 | Moussie | |
| 4,498,226 A | 2/1985 | Inoue et al. | |
| 4,499,557 A | 2/1985 | Holmberg et al. | |
| 4,507,757 A | 3/1985 | McElroy | |
| 4,543,594 A | 9/1985 | Mohsen et al. | |
| 4,554,570 A * | 11/1985 | Jastrzebski et al. | 257/331 |
| 4,569,121 A | 2/1986 | Lim et al. | |
| 4,646,266 A | 2/1987 | Ovshinsky et al. | |
| 4,677,742 A | 7/1987 | Johnson | |
| 4,774,556 A * | 9/1988 | Fujii et al. | 257/316 |
| 4,811,114 A | 3/1989 | Yamamoto et al. | |
| 4,820,657 A | 4/1989 | Hughes et al. | |
| 4,823,181 A | 4/1989 | Mohsen et al. | |
| 4,876,220 A | 10/1989 | Mohsen et al. | |
| 4,881,114 A | 11/1989 | Mohsen et al. | |
| 4,899,205 A | 2/1990 | Hamdy et al. | |
| 4,922,319 A | 5/1990 | Fukushima | |
| 4,943,538 A | 7/1990 | Mohsen et al. | |
| 5,070,383 A | 12/1991 | Sinar et al. | |
| 5,070,384 A | 12/1991 | McCollum et al. | |
| 5,306,935 A | 4/1994 | Esquivel et al. | |
| 5,311,039 A | 5/1994 | Kimura | |
| 5,334,880 A | 8/1994 | Abadeer et al. | |
| 5,391,518 A | 2/1995 | Bhushan | |
| 5,391,907 A | 2/1995 | Jang | |
| 5,426,321 A * | 6/1995 | Hyodo | 257/329 |
| 5,427,979 A | 6/1995 | Chang | |
| 5,441,907 A | 8/1995 | Sung et al. | |
| 5,455,435 A * | 10/1995 | Fu et al. | 257/329 |
| 5,463,244 A | 10/1995 | De Araujo et al. | |
| 5,535,156 A | 7/1996 | Levy et al. | |
| 5,536,968 A | 7/1996 | Crafts et al. | |
| 5,675,547 A | 10/1997 | Koga | |
| 5,737,259 A | 4/1998 | Chang | |
| 5,745,407 A | 4/1998 | Levy et al. | |
| 5,751,012 A | 5/1998 | Wolstenholme et al. | |
| 5,776,810 A | 7/1998 | Guterman et al. | |
| 5,821,591 A * | 10/1998 | Krautschneider et al. | 257/329 |
| 5,830,575 A * | 11/1998 | Warren et al. | 428/404 |
| 5,835,396 A | 11/1998 | Zhang | |
| 5,883,409 A | 3/1999 | Guterman et al. | |
| 5,973,356 A | 10/1999 | Noble et al. | |
| 5,978,258 A | 11/1999 | Manning | |
| 5,999,453 A | 12/1999 | Kawata | |
| 6,034,882 A | 3/2000 | Johnson et al. | |
| 6,049,106 A * | 4/2000 | Forbes | 257/67 |
| 6,157,061 A * | 12/2000 | Kawata | 257/315 |
| 6,310,376 B1 * | 10/2001 | Ueda et al. | 257/315 |
| 6,313,487 B1 * | 11/2001 | Kencke et al. | 257/316 |
| 6,469,343 B1 * | 10/2002 | Miura et al. | 257/324 |

OTHER PUBLICATIONS

S.D. Brotherton et al.: "Excimer–Laser–Annealed Poly–Si Thin–Film Transistors," IEEE Transactions on Electron Devices, Feb. 1993, pp. 407–413, vol. 40, No. 2, IEEE.

P. Candelier et al.: "Simplified 0.35–$\mu$m Flash EEPROM Process Using High–Temperature Oxide (HTO) Deposited by LPCVD as Interpoly Dielectrics and Peripheral Transistors Gate Oxide," IEEE Electron Device Letters, Jul. 1997, pp. 306–308, vol. 18, No. 7, IEEE.

Min Cao et al.: "A High–Performance Polysilicon Thin–Film Transistor Using XeCl Excimer Laser Crystallization of Pre–Patterned Amorphous Si Films," IEEE Transactions on Electron Devices, Apr. 1996, pp. 561–567, vol. 43, No. 4, IEEE.

Mino Cao et al.: "A Simple EEPROM Cell Using Twin Polysilicon Thin Film Transistors," IEEE Electron Device Letters, Aug. 1994, pp. 304–306, vol. 15, No. 8, IEEE.

Bomy Chen et al.: "Yield Improvement for a 3.5–ns BIC-MOS Technology in a 200–mm Manufacturing Line," IBM Technology Products, 1993, pp. 301–305, VLSITSA.

Victor W.C. Chan et al.: "Three Dimensional CMOS Integrated Circuits on Large Grain Polysilicon Films," IEDM, 2000, IEEE.

Boaz Eitan et al.: "Alternate Metal Virtual Ground (AMG)—A New Scaling Concept for Very High–Density EPROM's," IEEE Electron Device Letters, pp. 450–452, vol. 12, No. 8, Aug. 1991, IEEE.

Boaz Eitan et al.: "NROM: A Novel Localized Trapping, 2–Bit Nonvolatile Memory Cell," IEEE Electron Device Letters, pp. 543–545, vol. 21, No. 11, Nov. 2000, IEEE.

Boaz Eitan et al.: "Multilevel Flash cells and their Trade–offs," IEEE Electron Device Letters, pp. 169–172, 1996, IEEE.

Dr. Heinrich Endert: "Excimer Lasers as Tools for Material Processing in Manufacturing," Technical Digest: International Electron Devices Meeting, 1985, pp. 28–29, Washington, DC, Dec. 1–4, 1985, Göttingen, Germany.

G.K. Giust et al.: "Laser–Processed Thin–Film Transistors Fabricated from Sputtered Amorphous–Silicon Films," IEEE Transactions on Electron Devices, pp. 207–213, vol. 47, No. 1, Jan. 2000, IEEE.

G.K. Giust et al.: "High–Performance Thin–Film Transistors Fabricated Using Excimer Laser Processing and Grain Engineering," IEEE Transactions on Electron Devices, pp. 925–932, vol. 45, No. 4, Apr. 1998, IEEE.

G.K. Giust et al.: "High–Performance Laser–Processed Polysilicon Thin–Film Transistors," IEE Electron Device Letters, pp. 77–79, vol. 20, No. 2, Feb. 1999, IEEE.

C. Hayzelden et al.: "Silicide Formation and Silicide–Mediated Crystallization of Nickel–Implanted Amorphous Silicon Thin Films," J. Appl. Phys. 73(12), Jun. 15, 1993, pp. 8279–8289, 1993 American Institute of Physics.

Stephen C.H. Ho et al.: "Thermal Stability of Nickel Silicides in Different Silicon Substrates," Department of Electrical and Electronic Engineering, pp. 105–108, 1998, IEEE.

Sung–Hoi Hur et al.: "A Poly–Si Thin–Film Transistor EEPROM Cell with a Folded Floating Gate," IEEE Transactions on Electron Devices, pp. 436–438, vol. 46, No. 2, Feb. 1999, IEEE.

J. Esquivel et al. "High Density Contactless, Self Aligned EPROM Cell Array Technology," Texas Instruments (Dallas), IEDM 86, pp. 592–595, 1986, IEEE.

R. Kazerounian et al.: Alternate Metal Virtual Ground EPROM Array Implemented in a 0.8µm Process for Very High Density Applications, IEDM 91, pp. 311–314, 1991, IEEE.

Chang–Dong Kim et al.: "Short–Channel Amorphous–Silicon Thin–Film Transistors," IEEE Transactions on Electron Devices, pp. 2172–2176, vol. 43, No. 12, Dec. 1996, IEEE.

Johan H. Klootwijk et al.: "Deposited Inter–Polysilicon Dielectrics for Nonvolatle Memories," IEEE Transactions on Electron Devices, pp. 1435–1445, vol. 46, No. 7, Jul. 1999, IEEE.

NEC Corporation: "A Novel Cell Structure for Giga–bit EPROMs and Flash Memories Using Polysilicon Thin Film Transistors," 1992 Symposium on VLSI Technology Digest of Technical Papers, pp. 44–45, 1992, IEEE.

Ja–Hum Ku et al.: "High Performance pMOSFETs With Ni(Si/sub x/Ge/sub 1–x Si/Sub 0.8/Ge/sub 0.2/gate, IEEE Xplore Citation," VLSI Technology, 200. Digest of Technical Paper Symposium on pp.: 114–115 Jun. 13–15, 2000.

Nae–In Lee et al.: "High–Performance EEPROM's Using N– and P–Channel Polysilicon Thin–Film Transistors with Electron Cyclotron Resonance N2O–Plasma Oxide," pp. 15–17, IEEE Electron Device Letters, vol. 20, No. 1, Jan. 1999, IEEE.

Jin–Woo Lee et al.: "Improved Stability of Polysilicon Thin–Film Transistors under Self–Heating and High Endurance EEPROM Cells for Systems–On–Panel," IEEE Electron Device Letters, 1998, pp. 265–268, IEEE.

Seok–Woon Lee et al.: "Pd induced lateral crystallization of Amorphous Si Thin Films," Appl. Phys. Lett. 66 (13), pp. 1671–1673, Mar. 27, 1995, American Institute of Physics.

K. Miyashita etal.: "Optimized Halo Structure for 80 nm Physical Gate CMOS Technology with Indium and Antimony Highly Angled Ion Implantation," IEDM 99–645, pp. 27.2.1–27.2.4, 1999, IEEE.

N.D. Young et al.: "The Fabrication and Characterization of EEPROM Arrays on Glass Using a Low–Temperature Poly–Si TFT Process," IEEE Transactions on Electron Devices, pp. 1930–1936, vol. 43, No. 11, Nov. 1996, IEEE.

Jung–Hoon Oh et al.: "A High–Endurance Low–Temperature Polysilicon Thin–Film Transistor EEPROM Cell," pp. 304–306, IEEE Electron Device Letters, vol. 21, No. 6, Jun. 2000, IEEE.

Webpage—M.C. Poon. et al.: "Thermal Stability of Cobalt and Nickel Silicides in Amorpho Crystalline Silicon," p. 1, IEEE Xplore, Electron Devices Meeting, 1997, Proceedings, 19 Hong Kong, 2000, IEEE.

Takeo Shiba et al.: "In–Situ Phosphorus–Doped Polysilicon Emitter Technology for Very High–Speed, Small Emitter Bipolar Transistors," IEEE Transactions on Electron Devices, pp. 889–897, vol. 43, No. 6, Jun. 1996, IEEE.

Seungheon Song et al.: "High Performance Transistors with State–of–the–Art CMOS Technologies," IEDM 99, pp. 427–430, 1999, IEEE.

Vivek Subramanian et al.: "Low–Leakage Germanium–Seeded Laterally–Crystallized Single–Grain 100–nm TFT's for Vertical Integration Applications," IEEE Electron Device Letters, pp. 341–343, vol. 20, No. 7, Jul. 1999, IEEE.

Yoshihiro Takao et al. "Low–Power and High–Stability SRAM Technology Using a Laser–Recrystallized p–Channel SOI MOSFET," IEEE Transactions on Electron Devices, pp. 2147–2152, vol. 39, No. 9, Sep. 1992, IEEE.

Kenji Taniguchi et al.: "Process Modeling and Simulation: Boundary Conditions for Point Defect–Based Impurity Diffusion Model," IEEE Transactions on Computer–Aided Design , pp. 1177–1183, vol. 9, No. 11, Nov. 1990, IEEE.

Hongmei Wang et al.: "Submicron Super TFTs for 3–D VLSI Applications," IEEE Electron Device Letters, pp. 391–393, vol. 21, No. 9, Sep. 2000, IEEE.

Hongmei Wang et al.: "Submicron Super TFTs for 3–D VLSI Applications," IEEE Electron Device Letters, vol. 21, No. 9, pp. 439–441, Sep. 2000, IEEE.

Hongmei Wang et al.: "Super Thin–Film Transistor with SOI CMOS Performance Formed by a Novel Grain Enhancement Method," IEEE Transactions on Electron Devices, pp. 1580–1586, vol. 47, No. 8, Aug. 2000, IEEE.

Marvin H. White et al. "On the Go With Sonos," Circuit & Devices, pp. 22–31, Jul. 2000, IEEE.

B.J. Woo et al.: "A Novel Memory Cell Using Flash Array Contactless Eprom (Face) Technology," IEDM, pp. 90–93, 1990, IEEE.

Webpage—Qi Xiang et al.: "Deep sub–100 nm CMOS with Ultra Low Gate Sheet Resista NiSi," VLSI Technology, 2000. Digest of Technical Paper Symposium on . . . pp. 76–77, IEEE Xplore, Jun. 13–15, 2000.

Qi Xiang et al."Deep Sub–100nm CMOS with Ultra Low Gate Sheet Resistance by NiSi," IEEE, pp. 76–77, 2000, Symposium on VLSI Technology Digest of Technical Papers.

Qiuxia Xu et al.: "New Ti–SALICIDE Process Using Sb and Ge Preamorphization for Sub–0.2 µm CMOS Technology," IEEE Transactions on Electron Devices, pp. 2002–2009, vol. 45, No. 9, Sep. 1998, IEEE.

Kuniyoshi Yoshikawa et al.: "An Asymmetrical Lightly Doped Source Cell for Virtual Ground High–Density EPROM's," IEEE Transactions on Electron Devices, pp. 1046–1051, vol. 37, No. 4, Apr. 1990, IEEE.

John R. Lindsey et al.: "Polysilicon Thin Film Transistor and EEPROM Characteristics for Three Dimensional Memory," The 198th Meeting of The Electrochemical Society, Volum 2000–2.

Brian Dipert: "Exotic Memories, Diverse Approaches," EDN Asia, Sep. 2001.

Dietmar Gogl et al.: "A 1–Kbit EEPROM in SIMOX Technology for High–Temperature Applications up to 250° C," IEEE Journal of Solid–State Circuits, Oct. 2000, vol. 35, No. 10, IEEE.

* cited by examiner

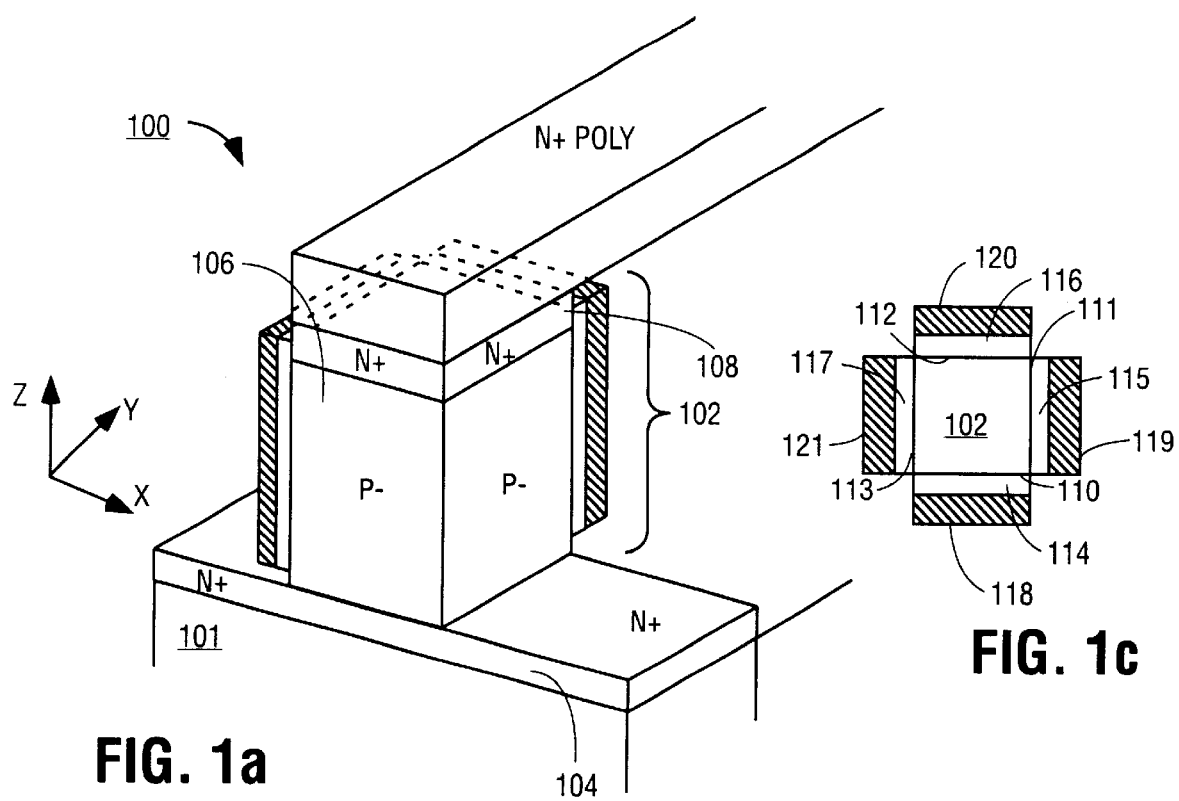
FIG. 1a
FIG. 1c
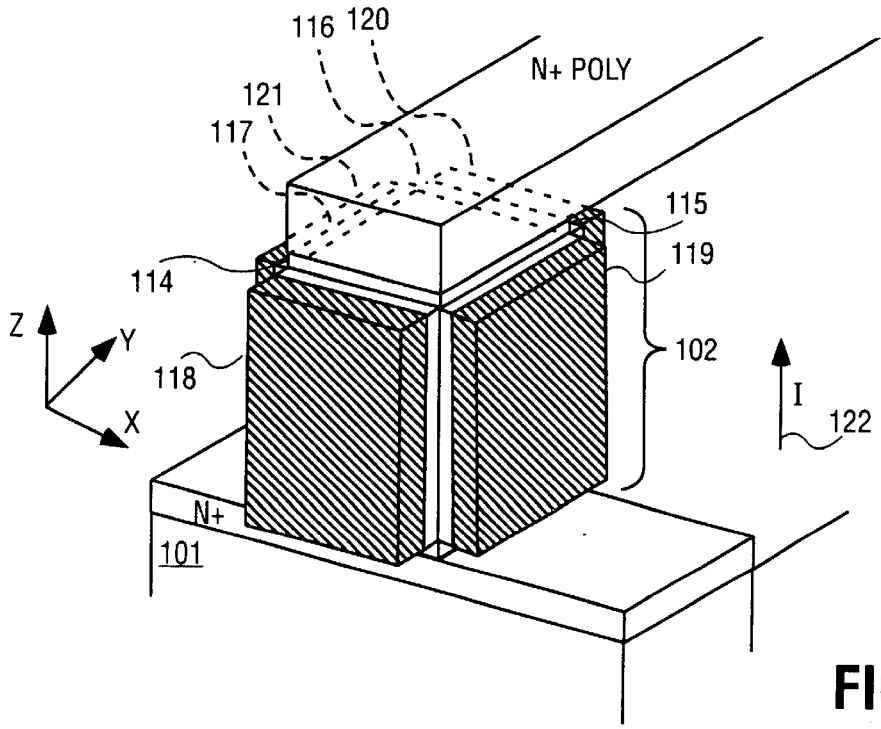
FIG. 1b

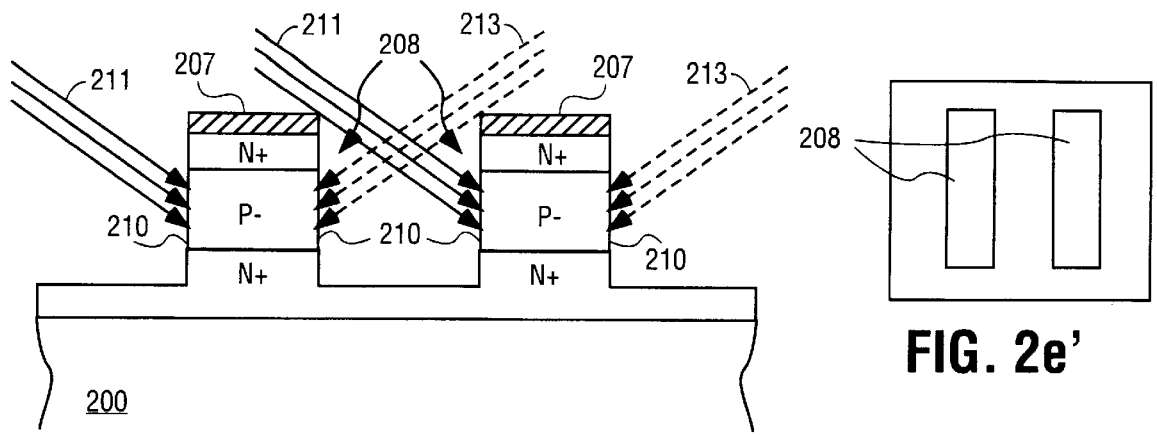
FIG. 2e
FIG. 2e'
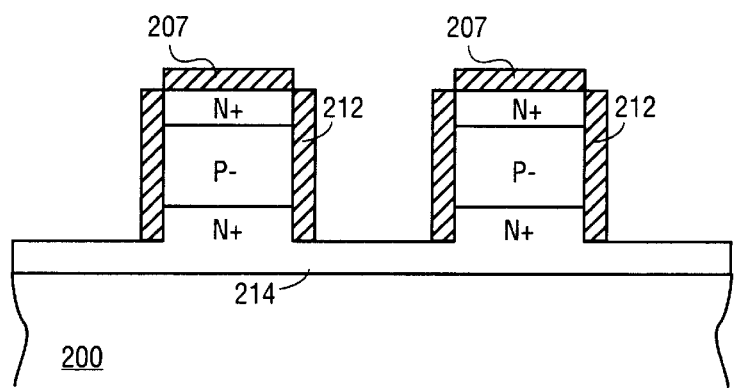
FIG. 2f
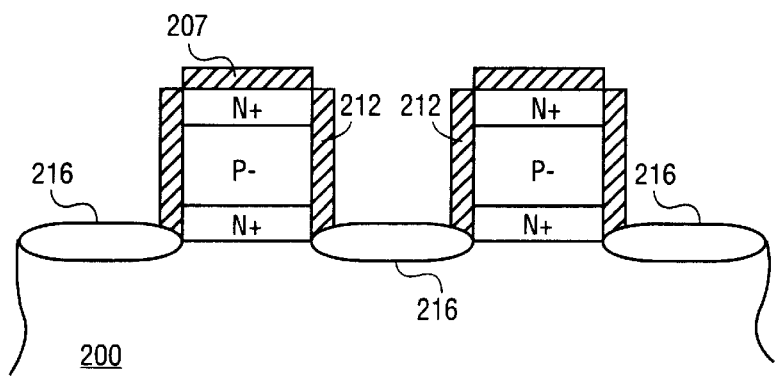
FIG. 2g

MULTIGATE SEMICONDUCTOR DEVICE WITH VERTICAL CHANNEL CURRENT AND METHOD OF FABRICATION

BACKGROUND OF THE INVENTION

1. Field of the Invention

The present invention relates to the field of nonvolatile memories and more specifically to a multibit nonvolatile memory and its method of fabrication.

2. Discussion of Related Art

As integrated circuits and computers have become powerful, new applications have arisen that require the ability to store large amounts of data. Certain applications require a memory with the ability to write and erase data and the ability to store data in a nonvolatile manner. Presently, such memories are formed with electrically erasable nonvolatile memories such as flash devices and EEPROMS. Unfortunately, these devices that are formed in the same plane and therefore require input/outputs (I/Os) which also run in the same plane. Having a source and drain input/output conductors running in the same plane, significantly reduces the number of devices that can-be fabricated in a single plane and thereby significantly reduces the storage capability of the memory.

What is desired is a nonvolatile memory device which can be easily fabricated in a dense array, so that large amounts of data can be stored in a nonvolatile manner.

SUMMARY OF THE INVENTION

According to a first aspect of the present invention a silicon channel body having a first and second channel surface is formed. A charge storage medium is formed adjacent to the first channel surface and a second charge storage medium is formed adjacent to the second channel surface. A first control gate is formed adjacent to the first charge storage medium adjacent to the first channel surface and a second control gate is formed adjacent to the second charge storage medium adjacent to the second surface.

According to a second aspect of the present invention, a transistor is provided that has a source, a channel, a drain, and a plurality of gates where the channel current flows vertically between the source and drain.

According to a third embodiment of the present invention, a memory element is formed using a transistor that has a read current that flows in a direction perpendicular to a substrate in or over which the transistor is formed. The transistor has a charge storage medium for storing its state. Multiple control gates address the transistor.

BRIEF DESCRIPTION OF THE DRAWINGS

FIGS. 1*a* and 1*b* are illustrations of isometric views of a pillar memory or transistor having multiple gates in accordance with the present invention.

FIG. 1*c* is an illustration of an overhead view of the pillar memory or transistor shown in FIGS. 1*a* and 1*b*.

DETAILED DESCRIPTION OF THE PRESENT INVENTION

Figure 1D:
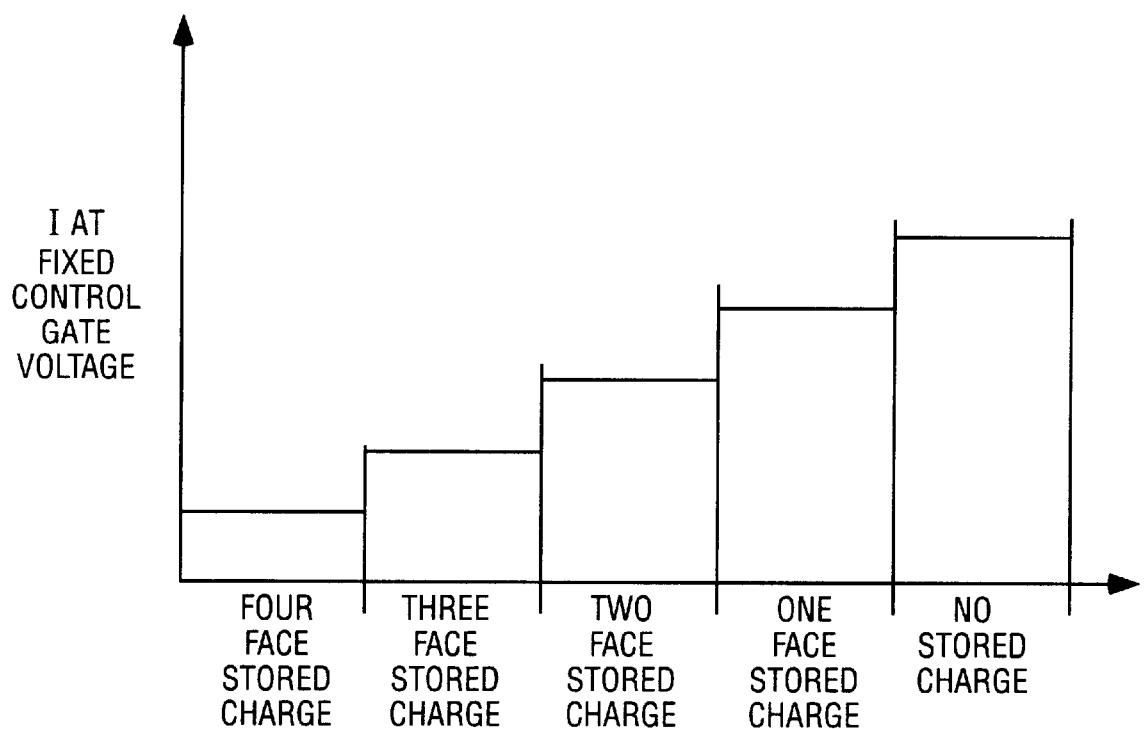
FIG. 1*d* is a graph which illustrates the ability to simultaneously store and read multiple bits of information from a single pillar memory in accordance with the present invention.

The present invention is a novel multigate semiconductor device having vertical channel current and its method of fabrication. In the following description numerous specific details are set forth in order to provide a thorough understanding of the present invention. One of ordinary skill in the art will appreciate that these specific details are not necessary to practice the present invention. In other instances, well-known semiconductor memory layout and processing techniques have not been described in specific detail in order to not unnecessarily obscure the present invention.

The present invention is a novel multigate semiconductor device and its method of fabrication. The multigate semiconductor device can be used as a multibit nonvolatile memory or as a multiple gate transistor. The present invention will be described with respect to a multibit nonvolatile memory. A multibit nonvolatile memory 100 in accordance with the present invention is illustrated in FIGS. 1*a*–1*c*. Nonvolatile memory device 100 includes a pillar 102. Pillar 102 comprises a stack of film providing a first source/drain region 104, a channel or body region 106, and a second source/drain region 108 formed on the channel region. In one embodiment of the present invention, the pillar includes a first source/drain region 104 formed from a heavily doped N+ single crystal silicon film having a doping density in the range between $1 \times 10^{19}$ to $1 \times 10^{20}$ atoms/cm$^3$, a body 106 formed from a P type single crystal silicon film having a doping density between $1 \times 10^{16}$ to $1 \times 10^{18}$ atoms/cm$^3$ and a second source/drain region 108 formed from a heavily doped N+ single crystal silicon film having a doping density between $1 \times 10^{19}$ to $1 \times 10^{20}$ atoms/cm$^3$.

The N+ source/drain regions 104 and 108 can have thickness between 500–1000 Å. The thickness of the P type silicon body defines the channel length of the device (i.e., the distance between the source and drain region). The thickness of the P type body 106 can be between 1000–7000 Å and is dependent upon the programming voltages desired for the device. For low programming voltages (e.g., 4–5 volts) the P type silicon film 106 can have a thickness between 1000–2500 Å while for higher programming voltages (e.g., 6–10 volts) a P type silicon film having a thickness between 6000–7000 Å can be used.

In an embodiment of the present invention the pillar 102 is formed so the first source/drain region 104, the body 106, and the second source/drain region 108 are each vertically aligned over one another as shown in FIG. 1*a*. The pillar 102 is formed in a rectangular or square pattern so that the pillar has four separate faces or sides 110, 111, 112, and 113 as shown in FIG. 1*c*. Pillar 108 has two faces 110 and 112 which are along laterally opposite sides and two other faces 111 and 113 which are formed along laterally opposite sides.

In memory device 100 adjacent to each face 110–113 is a charge storage medium 114, 115, 116, and 117 as shown in FIG. 1*c*. In one embodiment of the present invention, the charge storage mediums 114–117 are formed from a deposited oxide having H+ ions contained therein. A H+ containing oxide acts as a charge trapping dielectric enabling it to store charge therein. In another embodiment of the present invention, the charge storage mediums 114–117 are a silicon oxide-silicon nitride-silicon oxide (i.e., ONO) dielectric stack. In another embodiment of the present invention, the charge storage mediums 114–117 can be nanocrystals isolated by a tunnel dielectric from pillar 102 and isolated from a control gate by a control gate dielectric. In yet another embodiment of the present invention, the charge storage medium is a continuous conductive film floating gate such as polysilicon isolated by a tunnel dielectric from pillar 102 and isolated from a control gate by a control gate dielectric.

Adjacent to and in direct contact with each charge storage medium 114–117 is a separate independently controllable control gate 118, 119, 120, and 121 as shown in FIG. 1c. Because the memory 100 of the present invention contains separately controllable control gates, each charge storage medium adjacent to each face 110–113 can be independently and separately programmed (written into) or unprogrammed (erased). The control gates and charge storage medium are constructed so that they lie laterally adjacent to the pillar 102 so that they may electrically communicate with pillar 102. The charge storage medium is the region that electrically screens the control gate and the channel region addressed by the control gate.

The programmed or unprogrammed state of each face of the pillar memory is determined by whether or not charge is stored in the respective charge storage medium 114–117. The charge stored in the charge storage medium adds or subtracts from the voltage applied to the control gate thereby altering the voltage required to form a conducting channel in silicon channel 106 to enable a current (e.g., a read current) to flow between the first and second source/drain regions 104 and 108. The voltage required to form a conducting channel is defined as the threshold voltage $V_T$. The amount of voltage required to form a conducting channel for a given amount of current in each face of body 106 can be used to determine whether or not the face is programmed or unprogrammed. Alternatively, the amount of current (read current) generated for a given control gate voltage can be used to determine whether or not the face is programmed or unprogrammed. During read operations of device 100, when a conductive channel is formed in body 106, current 122 flows vertically (or perpendicular) (z) with respect to the plane (x-y) of the substrate 101 on which the pillar memory device is formed.

The state of pillar memory device 100 can be read or determined in a number of different ways that can enable multiple states and therefore multiple bits to be stored in a single pillar memory 100. In one embodiment, each face or surface of pillar memory 100 is read sequentially or independently. In such a scheme, a positive voltage (e.g. 3 volts) can be applied to the drain region while a given positive gate vote (e g. 4–5 volts) is sequentially or independently applied to each control gate. If a current is sensed at the source for a given control gate voltage then it is indication that no charge is stored in the associated charge storage medium. (It is to be appreciated that in an NMOS device (i.e. N+/P–/N+ pillar) that when electrons are stored in a charge storage medium, the electrons subtract from the positive voltage placed on the control gate thereby inhibiting the formation of a conductive channel in the respective face.) Each control gate can be separately probed to determine whether or not charged is stored in each associated charge storage medium. In this way, each face of pillar memory 100 can store a separate bit of information for a total of 4 bits during a sequential read.

In another scheme utilizing a sequential or independent read, different amounts of charge can be stored in each charge storage medium. That is, in an embodiment of the present invention different amounts of charge (e.g. charge amount 1, charge amount 2, charge amount 3 wherein charge amount 3>charge amount 2>charge amount 1) can be stored in each charge storage medium. Each face can then be sequentially or independently read as discussed above. The amount of stored charge will determine the amount of current that flows through each face for a given amount of control gate voltage. If for example, a charge storage medium storing charge amount 3 would result in no current flowing through the face, when charge amount 2 is stored in the charge storage medium a first amount of current would flow through the face, and when charge amount 1 is stored a larger current would flow and when no charge is stored the largest of current would flow. In this way, each face of pillar memory 100 can have four states and thereby store 2 bits of information enabling a single pillar memory 100 to store 8 bits of information during a sequential or independent read scheme.

In another read scheme in accordance with the present invention, the pillar memory 100 can be read in a parallel fashion whereby a positive voltage of for example, 3 volts, is applied to the drain while a given positive voltage (e.g. 4–5 volts) is applied simultaneously to each control gate and the amount of read current that flows into the source region is sensed. In the parallel read scheme when a given voltage is applied to each control gate simultaneously, the current that flows into the source is the summation of the currents flowing through each face of body 106. For example, as shown in FIG. 1d, when no face contains store charge the totally or summation current is the largest. When only one face stores charge the summation current is the next largest and so on. In this way, a single pillar memory has five identifiable states enabling up to 2-½ bits to be stored and read simultaneously in a single pillar memory 100. It is to be appreciated that parallel read and write operations can be significantly faster than sequential read and write operations.

In yet another embodiment of the present invention, each face or surface 110–113 of a P type body 106 has a different doping density thereby creating different threshold voltages in each face 110–113. The different doping densities can be formed utilizing threshold adjusting implants. The doping densities are chosen so that each face creates a distinct and identifiable amount of read current for a given voltage. For example, one face can have a threshold voltage so that either no current flows or a current $I_1$ flows through the face; a second face can have a threshold voltage so that either no current flows or a current $I_2$ flows wherein $I_2=2\times I_1$; a third face can have a third threshold voltage so that either no current flows or a current $I_3$ flows where $I_3=3\times I_1$, and a fourth face can have a fourth threshold voltage so that either no current flows or a current $I_4$ flows wherein $I_4=4\times I_1$. In this way, when a given voltage is applied to all control gates simultaneously, one of 16 different summation currents will result (i.e. 0, $1\times I_1$, $2\times I_1$, $3\times I_1$, . . . ) will occur thereby indicating one of 16 states and enabling up to 4 bits of information to be simultaneously stored and read in pillar memory 100.

Still further, it is conceivable that one can utilize different threshold voltages in each pillar face as well as store different amounts of charge in each charge storage medium to thereby provide more states in pillar memory 100 and enable the storing of simultaneous read and write of even more bits in a single pillar memory.

It is to be appreciated that although the memory device 100 as shown in FIGS. 1a–1c has four independently controllable control gates, it is possible to form a pillar memory which only has two or three independently controllable control gates. For example, control gates around a single rectangular pillar can be coupled together to form two or three independently controlled control gates. Additionally, it is conceivable to form a pillar memory having more than four faces to enable more states to be stored in a single pillar. For example, one can form a pillar having a triangle, pentagon, hexagon, or octagon shape to provide additional faces.

In order to store charge in one of the charge storage mediums 114–117, electrons can be placed in the charge storage mediums 114–117 utilizing drain side programming by grounding the source region while a relatively high voltage is applied to the drain region and while approximately 4–5 volts for low voltage operations or 6–10 volts for high voltage operations is applied to the respective control gate in order to invert a portion of the P type silicon body 106 into N type silicon so that a channel region is formed and the electrons flow between the source region and the drain region. The high control gate voltage pulls electrons from the inverted channel region and into the charge storage medium. It is to be appreciated that other programming techniques such as source side injection can be used to store charge in charge storage mediums 114–117.

The charge storage mediums 114–117 can be erased by placing a relatively high positive voltage (3 volts) on the source region while applying a negative voltage of approximately 4–5 volts for low voltage operations and a negative voltage of 6–10 volts for high voltages operations onto the respective control gate. The positive voltage on the source region attracts electrons trapped in the charge storage medium and thereby pulls the electrons from the charge storage medium and into the source region.

It is to be appreciated that memory device 100 as shown in FIGS. 1a–1c can be made of opposite polarity by simply reversing the conductivity type of each of the silicon regions in the pillar and maintaining concentration ranges. In this way, not only can NMOS devices be fabricated as shown in FIG. 1a, but also PMOS devices can be formed if desired.

Although the multigate memory device 100 of the present invention has been illustrated in FIGS. 1a–1c utilizing a N+/P−/N+ single crystal silicon structure, it is to be appreciated that other pillar compositions can be used. For example, a gated diode memory device having multiple control gates can be formed from a pillar comprising a P+/P−/N+ single crystalline structure. The P+ and N+ regions provide contacts to the P− silicon body or channel and can have a thickness between 500–1000 Å and doping density between $1\times10^{19}$ to $1\times10^{20}$ atoms/cm$^3$. Such a single crystalline silicon structure can be formed by forming the P+ type silicon region in a single crystalline substrate and then growing a P− single crystalline silicon film on the P+ type silicon region and then forming a N+ single crystalline silicon region on the P− single crystalline silicon region by for example ion implanting N type dopants into the P− single crystalline silicon and counter doping it to N+. Additionally, the silicon film used to form pillars may be silicon alloy films such as silicon germanium doped with N type or P type conductivity ions to the desired concentration.

Figure 2A:
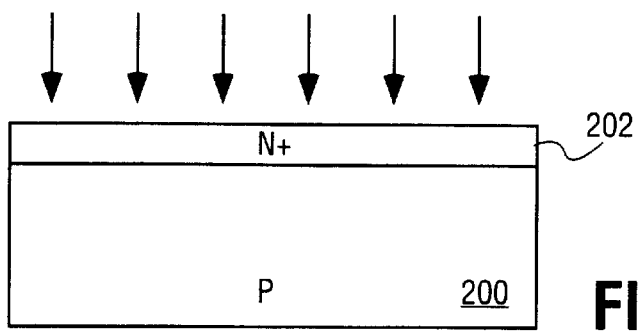
FIGS. 2*a*–2*e*, 2*e'* and 2*f*–2*r* illustrates a method of fabricating a multigate transistor or memory having a vertical read current in accordance with the present invention.

A method of fabricating a multibit nonvolatile pillar memory 100 as shown in FIG. 1a will now be described. According to the present invention a starting substrate 200 is provided. In an embodiment of the present invention as shown in FIG. 2a starting substrate 200 is a P type monocrystalline silicon substrate having a doping density of between $1\times10^{15}$ to $1\times10^{17}$ atoms/cm$^3$. A heavily doped N+ region 202 having a doping density between $1\times10^{19}$ to $1\times10^{20}$ atoms/cm$^3$ is then formed in the top surface of the P type silicon substrate as shown in FIG. 2a. A heavily doped N+ region can be formed by ion-implanting or diffusing arsenic or phosphorous atoms into the P type monocrystalline silicon substrate and counter doping it to N type single crystal silicon.

Figure 2B:
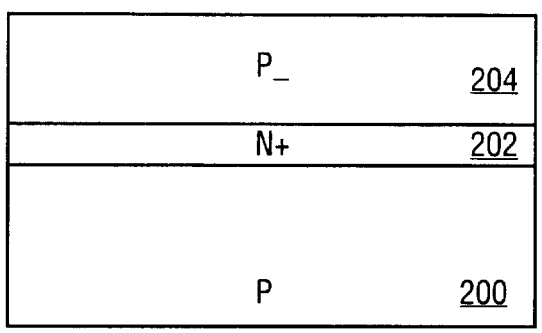

Next, as shown in FIG. 2b, a P type single crystal silicon film 204 having a doping density between $1\times10^{16}$ to $1\times10^{18}$ atoms/cm$^3$ is then grown on the heavily doped N+ region 202. A P type single crystal silicon film can be formed by chemical vapor deposition utilizing a process gas mix comprising a silicon source gas, such as but not limited to silane (SiH$_4$), and a P type dopant source to insitu dope the single crystal silicon film 204 with P type impurities (e.g., boron). Alternatively, an undoped single crystal silicon film can be deposited and doped by diffusion or ion implantation. The P type single crystal silicon film 204 is formed to at least a thickness desired for the channel length of the device which can be between 1000–7000 Å depending upon the program voltage desired.

Figure 2C:
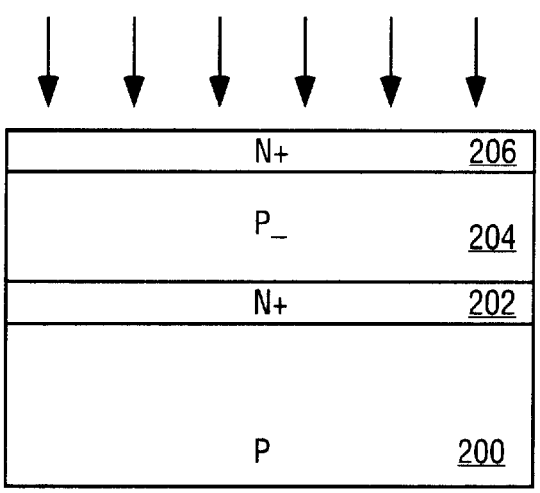

Next, as shown in FIG. 2c, the top surface of the P type crystalline silicon film is doped with N type impurities to form a N+ region 206 having a doping density between $1\times10^{19}$ to $1\times10^{20}$ atoms/cm$^3$. The thickness of the N+ doped region can be between 500–1000 Å. In an alternative to using ion-implantation or diffusion to form N+ region 206, an N+ crystalline film can be grown directly onto the P type silicon film 204. If ion-implantation or diffusion is used to form region 206, then the thickness of the P type silicon film 204 is deposited to a thickness required for the channel of the device and also for the N+ region 206.

Figure 2D:
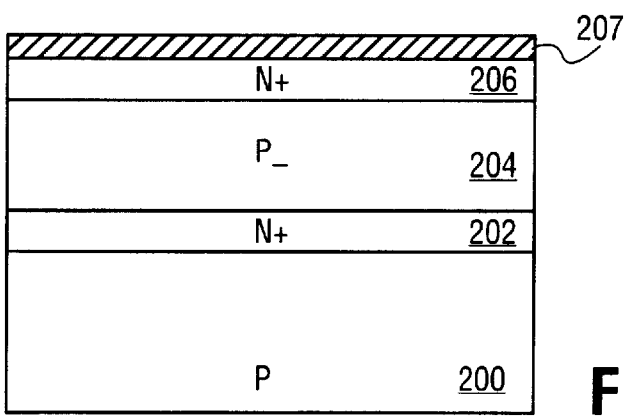

Next, an oxidation resistant film 207, such as a silicon nitride film, is blanket deposited onto N+ region 206 as shown in FIG. 2d. The oxidation resistant film may be used in combination with an interlayer film such as silicon dioxide to enable easier subsequent removal of the same. Next, as shown in FIG. 2e, the nitride layer 207, the N+ region 206, the P type region 204, and a portion or all of the N+ region 202 are patterned into a plurality of parallel strips or lines 208. FIG. 2e is a side view showing formed strips or lines 208. Well-known photolithography and anisotropic etching techniques can used to form the nitride/N+/P−/N+ strips 208 having substantially vertical sidewalls 210.

Next, as also shown in FIG. 2e, if desired the substrate can be subjected to threshold adjusting ion implantation steps in order to alter the doping density of each surface or face of the P type silicon region 204 of each strip 208. That is, at this time, a first ion implantation step 211 can be used to implant one surface of strips 208 with P type dopants to increase its P type doping density or can be implanted with N type dopants to counter dope and decrease its P type doping density. Similarly, after the first implant 211 the substrate can be rotated and subjected to a second ion implantation step 213 to alter the doping density of the opposite side or face of strips 208. The threshold adjustment implants should be of sufficient dose to sufficiently alter the threshold voltage of each face so as to be able to distinguish different read currents associated with each face. The angle of the ion implantation step is chosen so that the bulk of the implantation occurs into the surface of the sidewall 210 of the P type body 204. The angle of the implant is dependent upon the strip height as well as on the spacing between strips 208.

Next, as shown in FIG. 2f, an oxidation resistant film 212, such as silicon nitride, is formed along the sidewalls 210 of lines 208. A silicon nitride film 212 can be formed along the sidewalls 210 utilizing a "spacer" technique whereby a conformal silicon nitride film is first blanket deposited, by for example, plasma enhanced chemical vapor deposition (PECVD) over and around strips 208. The blanket deposited film is then anisotropically etched back so that it is removed from horizontal surfaces such as the remaining N+ film 214 located between strips 208. The etch back will also remove the film from the top of strips 208; however, the previously deposited silicon nitride film 207 on the top of the strips will remain.

Next, as shown in FIG. 2g, the substrate is oxidized to form silicon oxide isolation regions 216. Silicon oxide isolation regions 216 can be formed by heating the substrate to a temperature between 900–1050° C. and exposing the substrate to an oxidizing environment such as $O_2$ or $H_2O$. Silicon oxide 216 forms only on regions where silicon is exposed and available to react such as N+ regions 214 located between strips 208. No oxides form on the top or sides of the silicon strips 208 because the nitride films 207 and 212 protect the top and sidewalls of the strips and prevent the silicon from oxidizing. A silicon oxide isolation region can have thickness between 200–500 Å. Although a LOCOS isolation process is described, other isolation techniques such as oxygen implant or modified versions of trench isolation can be used.

Figure 2H:
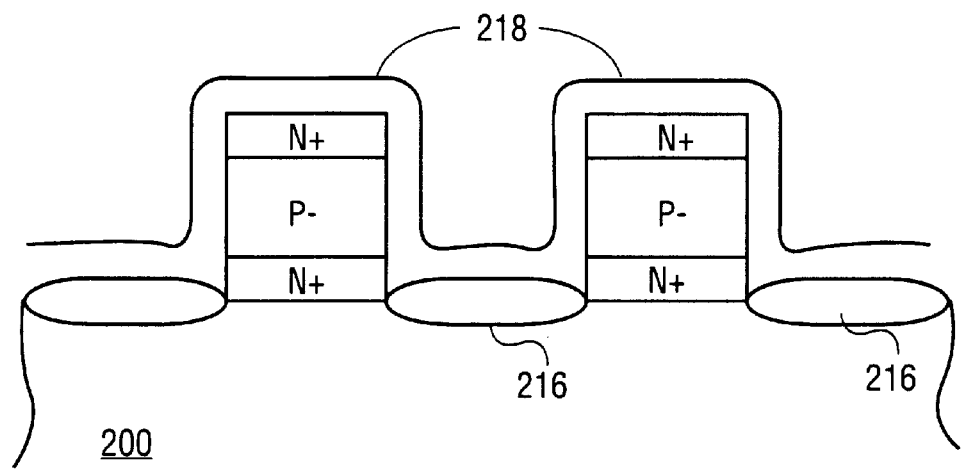

Next, as shown in FIG. 2h, the nitride films 207 and 212 are removed or stripped by well-known techniques from lines 208. Next, as also shown in FIG. 2h, a charge storage medium 218 is blanket deposited over and around strips 208 and onto oxide isolation regions 216 between strips 208. In an embodiment of the present invention the charge storage medium is a charge trapping dielectric. In one embodiment of the present invention, the charge trapping dielectric is an oxide film containing H+ ions. An H+ oxide film having a thickness between 100–400 Å can be used. A H+ oxide film can be formed by depositing silicon oxide film and then forming strains in the film by for example ion implantation of silicon or a high temperature anneal. The oxide film is then annealed at about 600° in a hydrogen ambient to incorporate hydrogen ions into the silicon oxide film at the strains. An example of a method of forming a H+ oxide film is described in U.S. Pat. No. 5,830,575.

In another embodiment of the present invention, the charge trapping dielectric is a silicon oxide-silicone nitride-silicon oxide composite film stack also known as an ONO film stack. In another embodiment of the present invention, the charge storage medium comprises a floating gate formed from a noncontinuous conductive nanocrystals which are isolated from strips 218 by a tunnel dielectric and from a subsequently formed control gate by a control gate dielectric.

Silicon nanocrystals can be formed by depositing silicon in a manner whereby silicon has a very high surface difusitivity relative to its sticking co-efficient. For example, silicon nanocrystals can be formed by chemical vapor deposition (CVD), by decomposing silane ($SiH_4$) at a very low pressure, between 1 millitorr to 200 millitorr, at a temperature between 250–650° C. In such a process, a very thin deposition, between 5–50 Å, will form little islands of silicon. If $H_2$ is included with silane during the deposition, higher pressures can be utilized and still obtain nanocrystals. In an alternative embodiment of the present invention, metal nanocrystals, such as aluminum nanocrystals, can be formed by sputtering from a metal target at a temperature near the melting temperature of the metal, so that the metal agglomerates and forms nanocrystals. Tungsten nanocrystals can be formed by chemical vapor deposition utilizing a reactant gas mix comprising a tungsten source gas such as $WF_6$ and germane ($GeH_4$). In still yet another embodiment of the present invention, a continuous film of floating gate material can be deposited and then caused to precipitate (by heating) to cause islands to form in the film.

It is to be appreciated that although nanocrystals are preferred for the floating gate, because of their self isolating quality, the floating gate can be formed from a continuous film such as, but not limited to, a metal such as tungsten or a silicon film such as polycrystalline or amorphous silicon doped to the desired conductivity type (typically N+ silicon for a N+/P−/N+ pillar). If a continuous film is used as floating gate material the film would be anisotropically etched at this time to remove the portion of the floating gate material between strips to electrically isolate the strips.

Figure 2I:
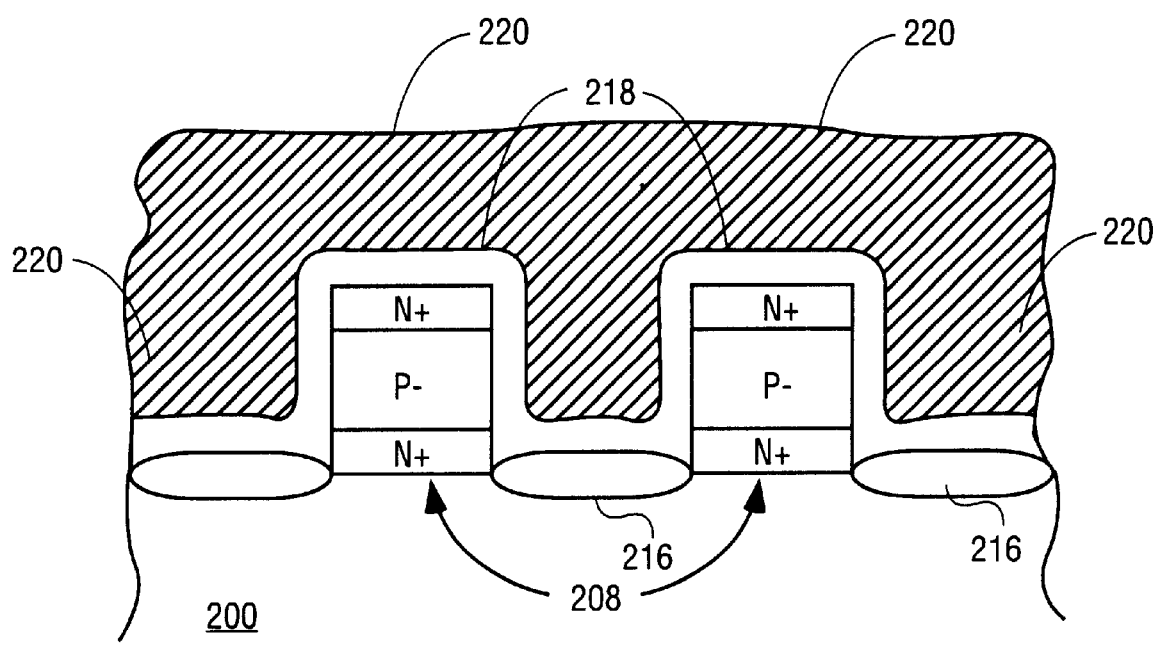
Figure 2J:
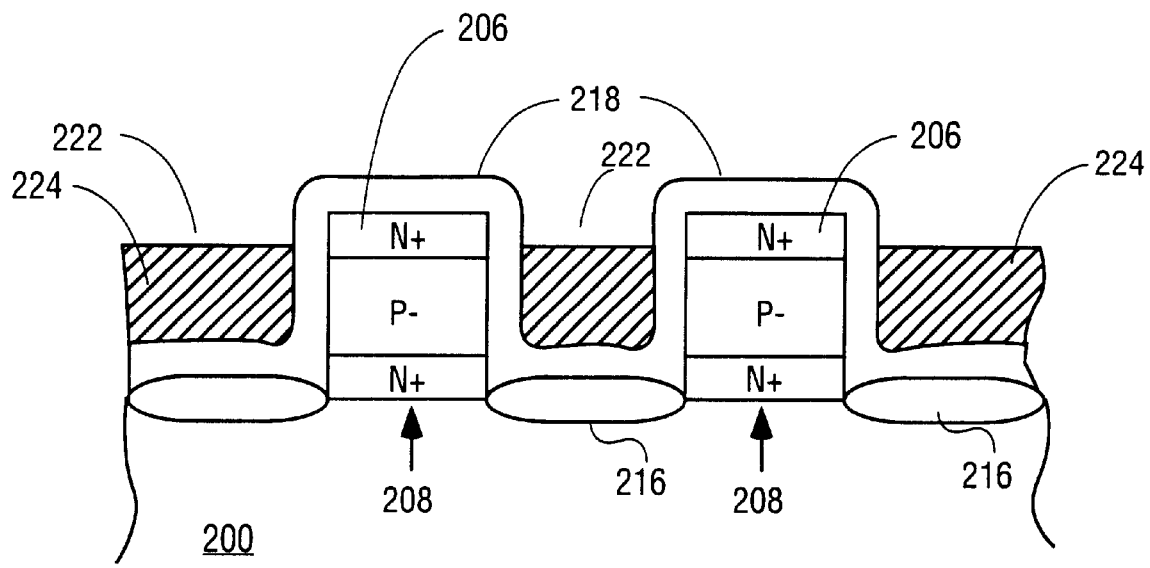

Next, as shown in FIG. 2i, a control gate material 220 is blanket deposited onto the charge storage medium 218 over and around strips 208. The control gate material is formed to a thickness at least sufficient to completely fill the gaps between adjacent strips. Typically, a conformal film deposited to a thickness of at least one-half the width of the gap while insuring complete filling of the gaps. In one embodiment of the present invention, the control gate material 220 is a blanket deposited N+ doped polysilicon film formed by chemical vapor deposition. Alternatively, the control gate can be formed from a blanket deposited tungsten film formed by chemical vapor deposition utilizing $WF_6$. Next, as shown in FIG. 2j, the control gate film 220 is planarized back, by for example, chemical mechanical polishing until the top surface of the control gate is substantially planar with the charge storage medium on top of strips 208. A plasma etch process is then utilized to recess 222 the top surface of the control gate material 220 below the top surface of strips 208 and preferably to slightly above the junction between N+ region 206 and P region 204. After the recess etch, a pair of control gates 224 have been formed along laterally opposite sidewalls 210 of strips 208. The above process forms control gates 224 adjacent to strips 208 in a self aligned manner.

Figure 2K:
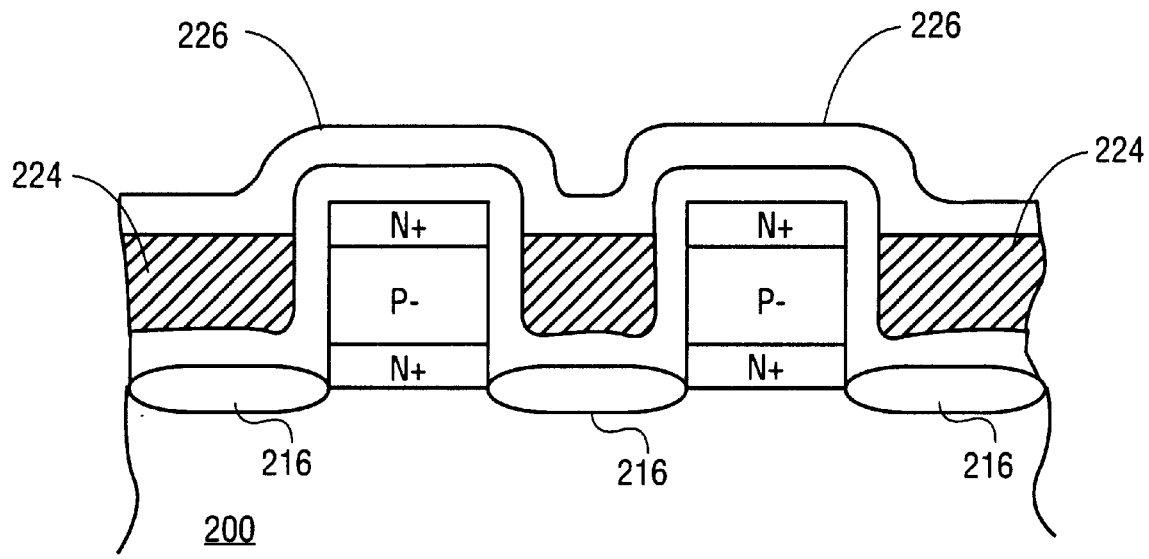

Next, as shown in FIG. 2k, an interlayer dielectric (ILD) 226, such as an oxide, is blanket deposited over the top of strips 208 and over the control gates 224 formed between adjacent strips. As shown in FIG. 21, is deposited oxide as well as the charge storage medium on the top of strips 208 are polished or etched back with well-known techniques such as chemical mechanical polishing to reveal and open the top surface of N+ region 206. The remaining oxide 226 on the control gates 224 provides isolation of control gates 224 from subsequently formed control gates and source/drain conductors. Interlayer dielectric 226 is formed to a thickness sufficient to completely fill recess 222.

Figure 2L:
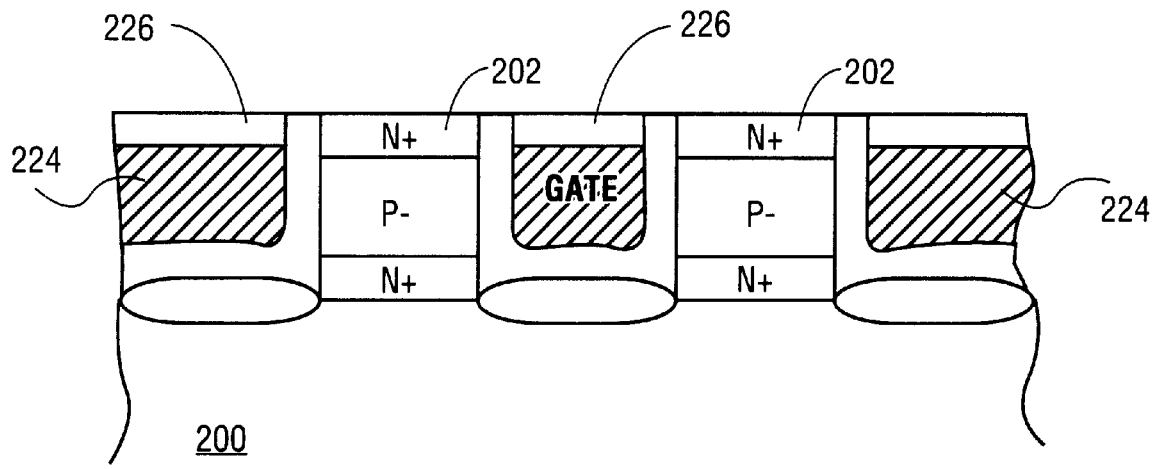
Figure 2M:
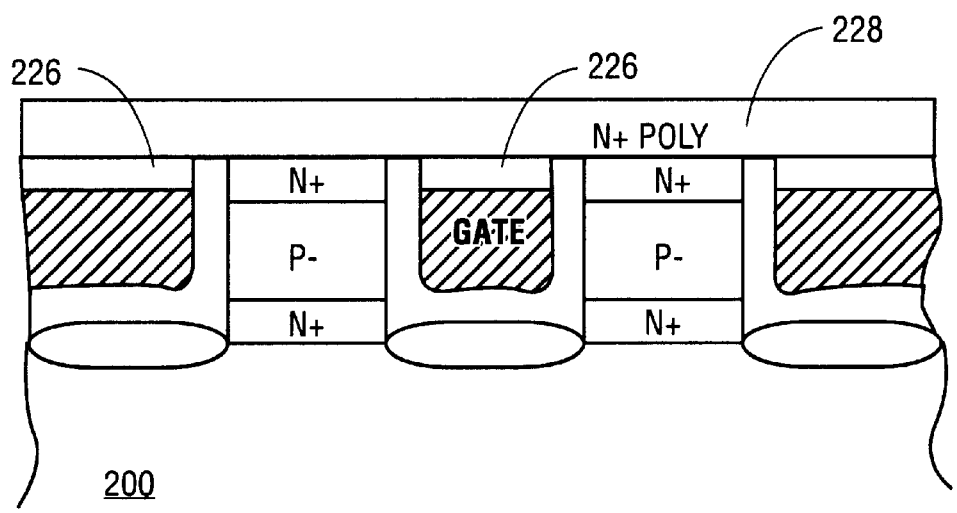

Next, a conductive layer 228 is blanket deposited onto ILD 226 and N+ region 206 of strips 208 as shown in FIG. 2m. In a preferred embodiment of the present invention the conductive film is a highly doped ($1 \times 10^{19}$ to $1 \times 10^{20}$ atoms/$cm^3$) N+ polycrystalline silicon film. A N+ polycrystalline silicon film can be formed by well-known techniques such as by chemical vapor deposition. Alternatively, conductive film 228 can be a metal conductor such as, but not limited to, tungsten or titanium silicide. A N+ polycrystalline silicon film 228 can be formed to a thickness between 1000–5000 Å.

Figure 2N:
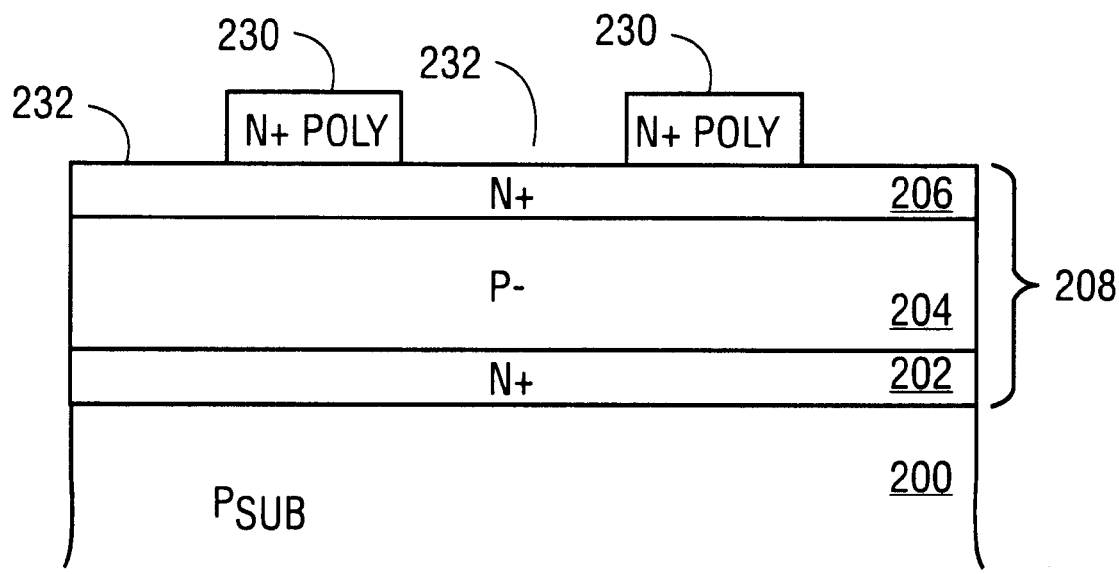
Figure 2O:
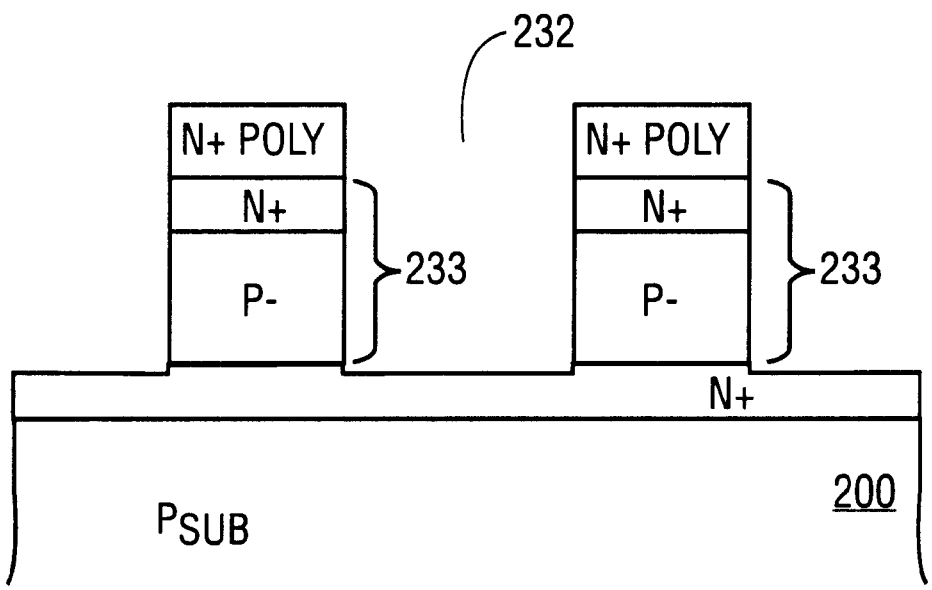

Next, as shown in FIG. 2n (substrate 200 rotated 90°), the conductive film 228 is patterned into a plurality of conductor lines 230 which run perpendicular or orthogonal to strip 208. Well-known photolithography and etching techniques can be used to pattern conductive film 228 into a plurality of parallel conductor lines 230. Next, as shown in FIG. 2o, the etch used to pattern conductor lines 230 is continued to remove the portion 232 of strip 208 not covered or masked by conductor lines 230. The etch is continued through the top N+ silicon region 206, and through the P− silicon region 204 and stops on or in the N+ region 202. In this way, as shown in FIG. 2o, square or rectangular pillars 234 are formed from the strips or lines 208 at the intersection or overlap of the lines 208 and the conductors 230. In an embodiment of the present invention, square shaped pillars having a width of less than 0.18 μm are formed. It is to be appreciated that the etch step preferably uses an etch which can selectively etch strip 208 with respect to ILD 226 and charge trapping dielectric 18. For example, silicon can be anisotropically etched utilizing a plasma etch which utilizes $CO_2$ and HBr without significantly etching in the oxide ILD 226. It is to be appreciated that ILD 226 protects and isolates the underlying control gate 224. N+ region 202 is left unetched and provides a conductor (wordline or bitline) which couples pillars 233 together in rows or columns. Similarly, conductor lines 230 provide a conductor (bitline or wordline) which couples pillars together in columns or rows.

At this time, if desired, the substrate can be subjected to successive ion implantation steps to alter the doping density of each newly revealed surface or face of P type body 204 of pillar 233 in order to alter the doping density of each newly revealed face and therefore the threshold voltage of each face.

Figure 2P:
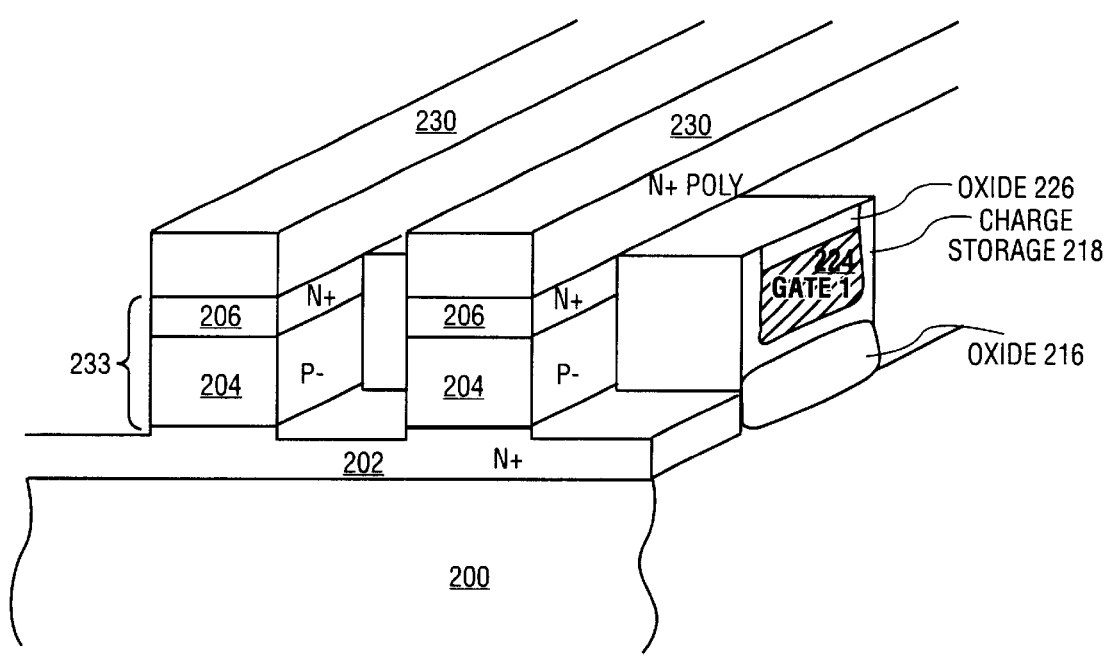
Figure 2Q:
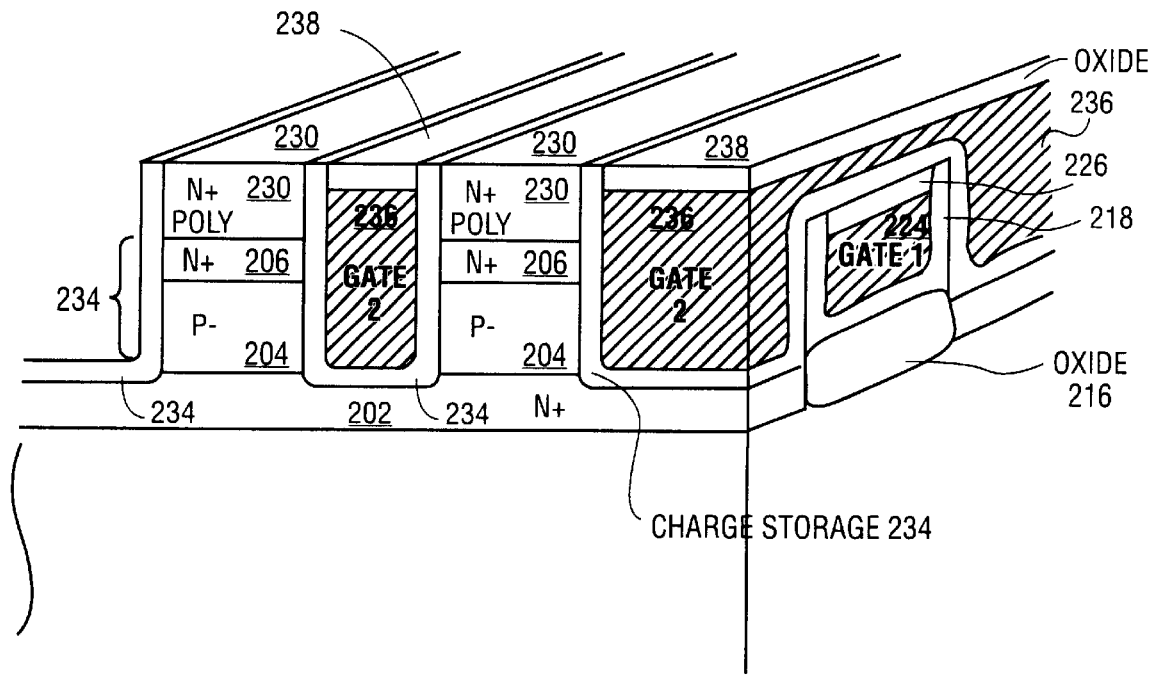

FIG. 2p is an isometric view after the etch which forms pillars 234. Next, as shown in FIG. 2q, a second charge storage medium 234 is blanket deposited over and around conductors 230 as well as pillars 234 and onto N+ region 202 and oxide dielectric 226. A second control gate material 236 is then blanket deposited over and onto second charge storage medium 234. The second control gate material is then polished back and optionally recessed as described with respect to FIG. 2j to form a second pair of control gates adjacent to laterally opposites sides of pillars 233. Additionally, and optionally a second interlayer dielectric 238 can then be blanket deposited and polished back as described with respect to FIGS. 2k and 2l to complete fabrication of the multibit nonvolatile memory device of the present invention.

Figure 2R:
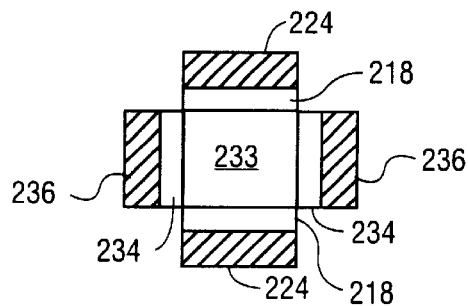

As shown in FIG. 2r, each pillar 233 has four faces whereby two laterally opposite faces have a charge storage medium 234 and independently controllable control gates 236 while the other laterally opposite faces have a charge storage medium 218 and independently controllable control gates 224.

At this time, the multibit nonvolatile pillar memory device of the present invention is complete. If desired, additional levels of multibit nonvolatile memory devices can be fabricated with the technique described above. In order to add additional levels of memory devices, one can use an overgrowth process to form a new layer of single crystalline silicon over the N+ polysilicon conductor 230 and ILD 238 in order to enable fabrication of the next level of memory devices. For example, one can use a laser anneal process to convert the top surface of the N+ polysilicon conductor 230 into single crystalline silicon and then to use the single crystalline silicon as a source from which to grow single crystal silicon over ILD 238. Alternatively, conductor 230 can be formed of material such as cobalt silicide or titanium silicide which closely matches the lattice structure of single crystalline silicon and therefore can be used as a source for the over growth of single crystal silicon over ILD 238.

It is to be appreciated that the fabrication of the multibit nonvolatile memory of the present invention has been described with respect to a specific preferred process. One of ordinary skill in the art will appreciate that other methods maybe utilized to fabricate the multibit nonvolatile memory of the present invention without departing from the scope of the present invention.

In an alternative embodiment of the present invention a multigate transistor having a vertical channel current is fabricated. That is, although the present invention has been described with respect to the formation of a nonvolatile memory device having a pillar with multiple faces and multiple charge storage mediums and multiple independently controlled gates, the same concepts and fabrication techniques can be used to fabricate NMOS or PMOS transistors having multiple gate electrodes and vertical channel currents. The structure and process of fabrication of a multigate MOS transistor with vertical channel current is the same as memory device 100 as shown in FIGS. 1a–1c except that instead of forming a charge storage medium 114–117 adjacent to each face 110–113, a gate dielectric is instead formed between each face 110–113 of pillar 102 and control gates 118–121 which are the gates of the transistor. Any well-known and suitable gate dielectric can be used such as but not limited silicon dioxide and silicon oxynitride. The gate dielectric will typically have a thickness between 10–50 Å. The fabricated MOS transistor having multiple gates and vertical read currents has a first source/drain region, a body or channel region, and a second source/drain region each substantially vertically aligned with one another. Each independently controlled gate would then prevent or allow a channel current to flow in its associated face of the pillar. When a channel current flows between the first and second source/drain region through a face of pillar 102, the channel current flows in a direction perpendicular (z) to the plane (x-y) of the single crystalline substrate on or in which the device is formed. Such a device can be used to form any type of logic device such as a microprocessor or a programmable logic array (PLA). The use of multiple gates surrounding a vertical structure enables high density integration of MOS devices. Additionally, because multiple gates are formed around a pillar having single source and a single drain region, the MOS device is ideally suited for dynamic or "domino" logic schemes.

Thus, a novel multigate semiconductor device with vertical channel current and its method of fabrication has been described.

We claim:

1. A multibit nonvolatile pillar memory comprising:
    a pillar comprising:
        a first source/drain region of a first conductivity type;
        a channel region of a second conductivity type different from the first conductivity type formed on the first source/drain region;
        a second source/drain region of the first conductivity type formed on the channel region;
        wherein said first source/drain region, said channel region, and said second source/drain region are in alignment and wherein said pillar has a first face and a second face opposite said first face, a third face adjacent to said first face and a fourth face opposite said third face;
    a charge storage medium comprising nanocrystals formed adjacent to each of said first, second, third and forth face of said pillar;
    a first control gate adjacent to said charge storage medium adjacent to said first face;
    a second control gate adjacent to said charge storage medium adjacent to said second face;
    a third control gate adjacent to said charge storage medium adjacent to said third face; and
    a fourth control gate adjacent to said charge storage medium adjacent to said fourth face.

2. A multibit nonvolatile pillar memory comprising:
    a pillar comprising:
        a first source/drain region of a first conductivity type;
        a channel region of a second conductivity type different from the first conductivity type formed on the first source/drain region;

a second source/drain region of the first conductivity type formed on the channel region;

wherein said first source/drain region, said channel region, and said second source/drain region are in alignment and wherein said pillar has a first face and a second face opposite said first face, a third face adjacent to said first face and a fourth face opposite said third face;

a charge storage medium formed adjacent to each of said first, second, third and forth face of said pillar;

a first control gate adjacent to said charge storage medium adjacent to said first face;

a second control gate adjacent to said charge storage medium adjacent to said second face;

a third control gate adjacent to said charge storage medium adjacent to said third face; and a fourth control gate adjacent to said charge storage medium adjacent to said fourth face; and wherein said charge storage medium is an oxide with H+ ions therein.

3. The memory of claim 1 wherein the channel region of said first face and the channel region of said third face have a different doping density.

4. A multibit nonvolatile pillar memory comprising:

a pillar comprising:
  a first source/drain region;
  a channel region formed on the first source/drain region;
  second source/drain region formed on the channel region; wherein said first source/drain region, said channel region, and said second source/drain region are in alignment and wherein said pillar has a first face
  and a second face opposite said first face, a third face adjacent to said first face and a fourth face opposite said third face;
  a charge storage medium formed adjacent to each of said first, second, third and forth face of said pillar;
  a first control gate adjacent to said charge storage medium adjacent to said first face;
  a second control gate adjacent to said charge storage medium adjacent to said second face;
  a third control gate adjacent to said charge storage medium adjacent to said third face;
  a fourth control gate adjacent to said charge storage medium adjacent to said fourth face; and
  wherein the channel region of said first face and the channel region of said third face have a different doping density; and
  the charge storage medium comprises nanocrystals.

5. The memory of claim 4 wherein the channel region of said first face, the channel region of said second face, the channel region of said third face, and the channel region of said fourth face each have a different doping density.

6. A multibit nonvolatile memory comprising:

a first source/drain region of a first conductivity type;

a channel region of a second conductivity type different from the first conductivity type having a first, a second and a third channel surface formed on said first source/drain region, a second source/drain region of the first conductivity type on said channel region;

a first charge storage medium adjacent to said first channel surface, a second charge storage medium adjacent to said second channel surface, and a third charge storage medium adjacent to said third channel surface, wherein the first, the second and the third charge storage medium comprise nanocrystals;

a first control gate adjacent to said first charge storage medium adjacent to said first channel surface;

a second control gate adjacent to said second charge storage medium adjacent to said second channel surface; and a third control gate adjacent to said third charge storage medium adjacent to said third channel surface.

7. A multibit nonvolatile memory comprising:

a first source/drain region of a first conductivity type;

a channel region of a second conductivity type different from the first conductivity type having a first, a second and a third channel surface formed on said first source/drain region, a second source/drain region of the first conductivity type on said channel region;

a first charge storage medium adjacent to said first channel surface, a second charge storage medium adjacent to said second channel surface, and a third charge storage medium adjacent to said third channel surface;

a first control gate adjacent to said first charge storage medium adjacent to said first channel surface;

a second control gate adjacent to said second charge storage medium adjacent to said second channel surface; and a third control gate adjacent to said third charge storage medium adjacent to said third channel surface; and wherein said first, second and third charge storage medium is an oxide with H+ ions therein.

8. The memory of claim 6 wherein a first portion of the channel region adjacent to said first surface and a second portion of the channel region adjacent to second surface have a different doping density.

9. The memory of claim 6 further comprising a fourth charge storage medium adjacent to a fourth surface of said channel region and a fourth control gate adjacent to said fourth charge storage medium.

10. The memory of claim 9 wherein a first portion of the channel region adjacent to said first surface, a second portion of the channel region adjacent to said second surface, a third portion of the channel region adjacent to said third surface, and a fourth portion of the channel region adjacent to said fourth surface each have a different doping density.

11. The memory of claim 6 wherein said first, said second and said third control gates are independently controllable.

12. A multibit nonvolatile pillar memory comprising:

a pillar comprising:
  a first source/drain region;
  a channel region formed on the first source/drain region;
  a second source/drain region formed on the channel region; wherein said first source/drain region, said channel region, and said second source/drain region are in alignment and wherein said pillar has a first face and a second face opposite said first face, a third face adjacent to said first face and a fourth face opposite said third face;

a charge storage medium formed adjacent to each of said first, second, third and forth face of said pillar;

a first control gate adjacent to said charge storage medium adjacent to said first face;

a second control gate adjacent to said charge storage medium adjacent to said second face;

a third control gate adjacent to said charge storage medium adjacent to said third face;

a fourth control gate adjacent to said charge storage medium adjacent to said fourth face; and wherein the channel region of said first face and the channel region of said third face have a different doping density; and said charge storage medium comprises an oxide with H+ ions therein.

13. A multibit nonvolatile memory comprising:

a first source/drain region;

a channel region having a first and a second channel surface formed on said first source/drain region, wherein a first portion of the channel region adjacent to said first surface, and a second portion of the channel region adjacent to second surface have a different doping density;

a second source/drain region on said channel region;

a first charge storage medium adjacent to said first channel surface and a second charge storage medium adjacent to said second channel surface, wherein the first and the second charge storage medium comprise nanocrystals or an oxide with H+ ions therein;

a first control gate adjacent to said first charge storage medium adjacent to said first channel surface; and a second control gate adjacent to said second charge storage medium adjacent to said second channel surface.

14. The memory of claim 13 further comprising:

a third charge storage medium adjacent to a third surface of said channel region and a third control gate adjacent to said third charge storage medium; and a fourth charge storage medium adjacent to a fourth surface of said channel region and a fourth control gate adjacent to said fourth charge storage medium.

15. The memory of claim 14 wherein the third and the fourth charge storage medium comprise nanocrystals or an oxide with H+ ions therein.

16. The memory of claim 14 wherein the first portion of the channel region adjacent to said first surface, the second portion of the channel region adjacent to said second surface, a third portion of the channel region adjacent to said third surface, and a fourth portion of the channel region adjacent to said fourth surface each have a different doping density.

17. The memory of claim 13 wherein said first and said second control gates are independently controllable.

18. The memory of claim 13 wherein the first charge storage medium and the second charge storage medium comprise nanocrystals.

19. The memory of claim 13 wherein the first charge storage medium and the second charge storage medium comprise an oxide with H+ ions therein.

* * * * *